United States Patent [19]

Toone

[11] 3,996,611
[45] Dec. 7, 1976

[54] CATHODE RAY TUBE DEFLECTION CIRCUIT

[75] Inventor: Rodney K. Toone, Sunnyvale, Calif.

[73] Assignee: Aeronutronic Ford Corporation, Blue Bell, Pa.

[22] Filed: Sept. 25, 1974

[21] Appl. No.: 509,085

[52] U.S. Cl. .................................. 358/51; 315/9; 315/368
[51] Int. Cl.² .................. H04N 9/09; H04N 9/31
[58] Field of Search ............... 315/13 C, 371, 368, 315/370, 9; 358/51

[56] References Cited
UNITED STATES PATENTS

| 2,426,979 | 9/1947 | Ayres | 315/9 X |
| 2,587,420 | 2/1952 | Wendt | 315/9 |
| 2,621,245 | 12/1952 | Kell | 358/51 |
| 2,654,854 | 10/1953 | Seright | 315/9 X |
| 3,305,750 | 2/1967 | Schneider | 315/9 |
| 3,340,422 | 9/1967 | Bull | 315/368 |
| 3,428,852 | 2/1969 | Greenblum | 315/9 |
| 3,443,147 | 5/1969 | Schneider | 315/9 |
| 3,613,108 | 10/1971 | Spannhake | 315/368 |
| 3,872,499 | 3/1975 | McConnell et al. | 358/51 |

FOREIGN PATENTS OR APPLICATIONS

| 1,134,703 | 8/1962 | Germany | 358/51 |

Primary Examiner—Malcolm F. Hubler
Attorney, Agent, or Firm—Robert D. Sanborn

[57] ABSTRACT

In a magnetically deflected cathode ray tube (CRT) display, the deflection coil is connected in series with two separate amplifiers. The first amplifier provides the main deflection current and is designed for high efficiency. The second amplifier is a linear device having relatively low efficiency and is made capable of supplying only a fraction of the output of the first amplifier. The linear amplifier is provided with deflection correction signals so that it modulates the deflection of the CRT in a desired manner. The correction signals can produce sweep linearization, convergence correction and raster shape control.

5 Claims, 2 Drawing Figures

CATHODE RAY TUBE DEFLECTION CIRCUIT

BACKGROUND OF THE INVENTION

In magnetic CRT deflection systems large energy values are involved in achieving the desired results. Unless a high-efficiency deflection system is employed, an inordinate amount of power must be expended in the deflection amplifier. It has been found that switching-type deflection generators produce the required deflection values while dissipating relatively little power. Accordingly such generators have come into wide use. However, while the switching circuits are highly useful they are very difficult to modulate so as to shape the deflection signals they produce. Since a switching-device is either off or fully on, any modulation of its output must be accomplished at high level, thus rendering sweep linearization and control very difficult.

The problems of sweep control are considerably aggravated in projection type CRT displays. In such devices a small CRT raster of great brightness is optically magnified and projected onto a viewing screen. Any magnification will clearly magnify any deflection errors. Therefore in projection type displays it is very important to be able to control the raster to produce an acceptable magnified picture.

Another problem in projection systems arises when the projector is not located perpendicular to the center of the viewing screen. Off-axis projection will produce a distorted raster shape and it is desirable to correct the deflection or raster scanning signals to offset such distortion.

Still another problem arises when a projection system involves more than one projector. If two or more rasters are to be projected, such as could be done in order to produce a color display, they will have to be converged so that all areas of each raster conform to the same areas of all of the other rasters. Clearly such convergence requires precision control of the shape of the scanning or deflection signals applied to the projectors.

The above-mentioned problems militate against high efficiency deflection systems and the typical approach is to use inefficient but controllable deflection amplifiers. This approach is wasteful of energy and the waste heat produced must be dissipated by some means. If the dissipation is not adequate, the amplifiers overheat and have short life. Also their excessive temperatures tend to degrade other nearby electronic components.

SUMMARY OF THE INVENTION

It is an object of the invention to provide a high efficiency CRT magnetic deflection system that also can be modulated to provide the required control of deflection.

It is a further object of the invention to provide a high efficiency CRT magnetic deflection system that can be modulated to provide precision control of deflection linearity, keystone raster modulation, and convergence control.

These and other objects are achieved by connecting two amplifiers to the coil used for magnetic deflection of a CRT. The first amplifier is of the high-efficiency switching type and has sufficient output to fully deflect the CRT electron beam. The second amplifier is designed to provide only a fraction, perhaps one third, of the output of the first amplifier but its response is linear. While the second amplifier is not of the high-efficiency type, its low rating means that the two amplifiers in combination still display overall high efficiency. Both amplifiers have their outputs connected in a series combination with the deflection coil so that both can control the CRT deflection. The high efficiency amplifier provides the main CRT deflection. The deflection current is sensed and compared with a waveform that represents the desired wave. Any difference is amplified and applied by way of the linear amplifier to the deflection coil as a correction voltage. In addition to the main correction signals such as those associated with raster convergence can be fed into the linear amplifier.

DESCRIPTION OF THE INVENION

Figure 1:
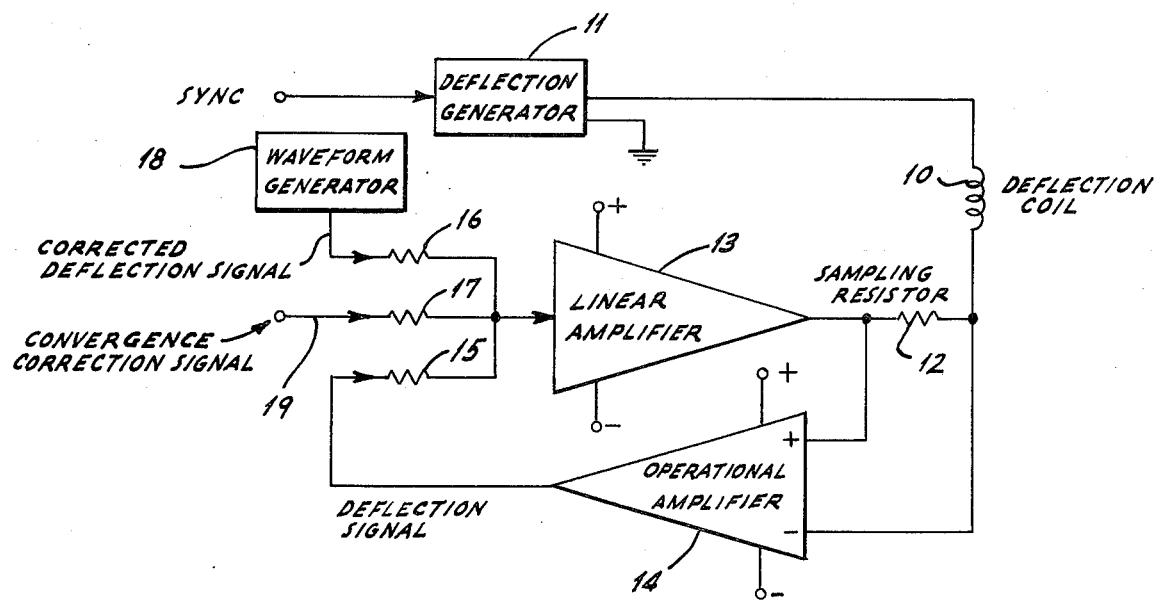
FIG. 1 is a block diagram showing the elements of the invention.

FIG. 1 is a block diagram of the system of the invention. Deflection coil 10 is mounted on a conventional projection CRT (not shown). It is desired to produce a linear sawtooth of deflection current in yoke 10 to provide a suitable beam deflection. Also not shown is a similar system for deflecting the CRT in a second direction to achieve a scanning raster. For example, the system shown could be the horizontal deflection circuit. The vertical circuit, while not separately shown, would be required and would be similar. The vertical deflection circuit is similar in its control requirements but it is operating at a much lower basic frequency and therefore can be achieved without the high efficiency switching circuit portion. The vertical deflection circuit uses only the linear amplifier.

Deflection generator 11 responds to the scanning synchronizing signal, in this instance the horizontal sync signal, to produce a sawtooth of current to provide the required magnetic deflection field about coil 10. Generator 11 is a conventional switching-type energy-recovery deflection circuit, chosen because of its high efficiency performance. The current produced by generator 11 in coil 10 is made adequate to scan the CRT over its required distance. The lower end of coil 10 is shown connected to current sampling resistor 12 which has a value small enough so that it does not disturb the action of the deflection circuit. Resistor 12 is in turn connected to the output of linear amplifier 13. The term linear amplifier as used herein is intended to mean an amplifying device that displays active gain over its operating signal range and is not intended to be limited to a device with precisely linear characteristics. In fact substantial departures from true linearity could be tolerated so long as the amplifier has adequate gain for all signal levels. Amplifier 13 is a power amplifier having an output power capability equal to a fraction of the power in the deflection circuit. For example the output of amplifier 13 could be about 30% of that of deflection generator 11. Amplifier 13 is shown provided with equal + and − power supply connections so that its quiescent output is at ground potential. Since amplifier 13 is a power amplifier and has a very low internal impedance at its output terminal, it acts relatively to any signal, by way of resistor 12, to return the bottom end of coil 10 to signal ground. Thus, insofar as deflection generator 11 is concerned, the lower end of coil 10 is effectively grounded.

Operational amplifier (op amp) 14 has its differential input connected across resistor 12. Therefore op amp 14 will be fed a sawtooth of voltage that is a replica of the sawtooth of current in coil 10. The output of op amp 14 is connected to the input of linear amplifier 13 by way of resistor 15. It can be seen that the output of amplifier 13 will include a signal representative of the current in coil 10. A corrected deflection signal is produced in waveform generator 18 and fed into linear amplifier 13 by way of resistor 16. This signal is generated to have the exact shape of the desired deflection current wave form. It is generated in conventional means not shown and will be basically a sawtooth with additional shaping to provide for desired raster corrections. For a detailed showing of the application of raster correction signals reference can be had to copending application Ser. No. 508,279 filed Sept. 23, 1974 by Harald M. Austefjord, now U.S. Pat. No. 3,943,279. The signal fed into amplifier 13 by way of resistor 16 is compared with the signal fed in by way of resistor 15 and any difference constitutes an input signal into amplifier 13. This signal is amplified and applied to coil 10 by way of resistor 12. If the gain of amplifier 13 is large the deflection current in coil 10 will have a waveform very close to that of the sweep voltage fed in at resistor 16. For example if the signal fed in by way of resistor 16 is the same shape and amplitude as the signal fed in by way of resistor 15, there will be no correction and hence no deflection contribution from amplifier 13. If there is some departure in deflection current waveform from the desired waveform, amplifier 13 will act to correct the departure. If a longer sweep is desired it is only necessary to increase the waveform amplitude out of waveform generator 18. Then within the capability of amplifier 13 the sweep will be increased. Since linear amplifier 13 needs to supply only the sweep correction, its power output does not need to be very great.

Line 19 feeds additional sweep correction voltages into linear amplifier 13 by way of resistor 17. This could be a precision convergence signal to correct for localized raster distortions. This signal too will modulate the sweep current to change the waveform thereof.

DESCRIPTION OF THE PREFERRED EMBODIMENT

Figure 2:
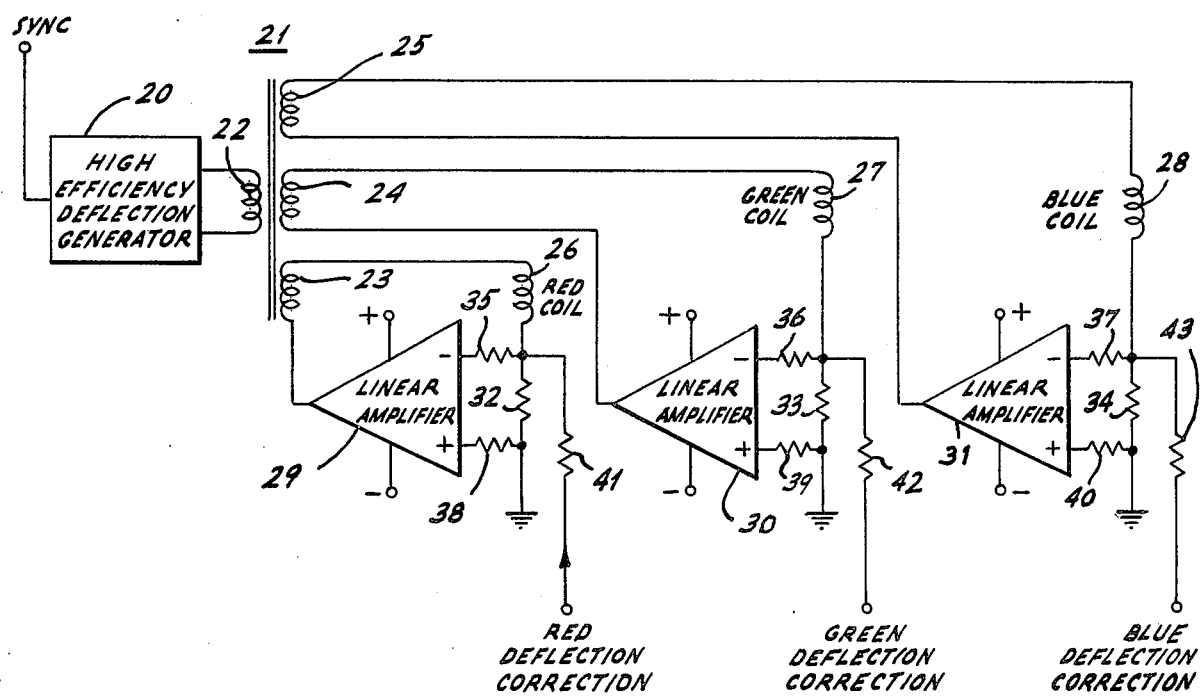
FIG. 2 shows the invention applied to a full color image display.

FIG. 2 shows an embodiment of the invention useful in a color image projection system. Three separate projectors are employed, one each for red, green, and blue images. When projected into a composite, a full color display can be achieved. In FIG. 2 one set of deflection coils is shown for the three projectors. These could be either the horizontal or vertical and it is to be understood that the second deflection circuit would be similar. Since the projectors are conventional magnetically deflected CRT devices, they too are not shown.

A single high efficiency deflection generator 20 suplies all three coils 23, 24 and 25 by way of coupling transformer 21. Energy is periodically, in synchronism with the system sync pulses, switched into primary winding 22. Such a deflection generator is well known in the art. Reference to such so called "energy recovery deflection" circuits is available in an article titled "*Horizontal Deflection Circuits for Television Receivers*"published in Design Manual for Transistor Circuits (McGraw-Hill Book Company, Inc. 1961,)on pages 182–185.

Secondary windings 23, 24, and 25 supply sawtooth deflection current signals to red deflection coil 26, green deflection coil 27, and blue deflection coil 28 respectively. The other ends of secondary windings 23, 24 and 25 are terminated by linear amplifiers 29, 30, and 31. Small value current sampling resistors 32, 33, and 34 return the lower ends of the deflection coils to ground. These resistors are on the order of 0.5 ohm each, a value small enough to have little effect on deflection coil current flow yet large enough to develop a small current-related voltage. Resistors 35, 36, and 37 connect the current related voltages across resistors 32, 33, and 34 to the inverting input terminals of linear amplifiers 29, 30, and 31 respectively. Each linear amplifier is provided with differential input and positive and negative power supply connections so that they have an operating output potential at ground potential. The non-invering inputs are returned to ground by resistors 38, 39, and 40.

Linear amplifiers 29, 30, and 31 are all identical and of conventional design. Their ratings should be such as to accomodate the required deflection current correction. A suitable commercially available device is the RCA type HC10000 Hybrid Linear Power Amplifier. Discussions of this amplifier are available in RCA Application Notes AN4474 and AN4483 both published in October, 1970.

Each deflection coil will receive the same drive from transformer 21 so that they will all produce nearly equal deflections. Each coil has its current sampled and the equivalent voltage applied to the inverting input of the associated linear amplifier. The deflection corrections waveforms one for each projector are fed by resistors 41, 42, and 43 into the inverting inputs also. At the inverting input terminal of each amplifier the waveforms are compared and any difference causes the linear amplifier to apply a correction voltage to the associated deflection coil. Thus each coil can be individually corrected and the signals applied as correction can be trimmed as desired to cause the red, green and blue deflections to precisely converge.

In such a system where three separate projectors are employed, it is clear that only one can be located on the axis that is perpendicular to and passes through the center of the viewing screen. The other two projectors must be off axis and their projected rasters will be slightly keystoned. Therefore assuming that the center projector is the green one and that it is centered, the red and blue projectors will have to be angled and keystoned to provide for convergent rasters. The signals necessary for such sweep correction are fed into the sweep circuits by way of resistors 41 and 43. Furthermore if all three projectors are off axis, such as would be encountered in a side wall or ceiling mounted projector setup, keystone correction signals could also be fed into the green deflection portion by way of resistor 42.

A new and useful magnetic deflection system for a CRT has been described and a specific system detailed. A person skilled in the art will see other alternatives and equivalents. Accordingly, it is intended that my invention be limited only by the following claims.

I claim:

1. A deflection system for use in a multiple unit magnetically deflected cathode ray tube display, said system comprising:
 a plurality of cathode ray tubes;
 a plurality of deflection coils, each deflection coil associated with a respective one of said cathode ray tubes;

a deflection current generator having a plurality of outputs, each output connected to one end of a related one of said plurality of coils, said generator being capable of supplying all of the current required to completely deflect the beams in said cathode ray tubes;

a plurality of linear amplifiers, each linear amplifier being capable of deflecting said beam of its associated cathode ray tube to an appreciable fraction of its normal requirement;

a plurality of sampling resistors, each connected between a second end of a related one of said deflection coils and the output of a related one of said linear amplifiers whereby each output of said deflection current generator, a related one of said deflection coils, a related one of said sampling resistors, and a related one of said linear amplifiers are connected in series combination, each of said sampling resistors having a resistance small compared to the resistance of the series combination with which it is associated;

a plurality of reference signal generating means, each generating a signal waveform representative of the desired current in a related one of said deflection coils;

a plurality of correctional amplifier means, each having its input coupled to a respective one of said sampling resistors;

a plurality of signal combining means, each combining the output of a related one of said reference signal generating means and the output of a related one of said correctional amplifier means and supplying the combined signal to the input of a related one of said linear amplifier means;

a source of a plurality of convergence correction signals; and means for supplying one of said convergence correction signals to the related input of at least all but one of said linear amplifiers, thereby to conform the displays of said plurality of cathode ray tubes.

2. The system of claim 1 wherein the efficiency of said deflection current generator is substantially greater than the efficiency of said linear amplifier.

3. The system of claim 1 wherein said linear amplifier is provided with equal positive and negative power supply voltages and differential inputs and the non-inverting of said inputs is returned to the reference level of the outpu of said linear amplifier.

4. The system of claim 3 wherein deflection correction voltage signals are applied to the inverting input of said differential inputs.

5. The system of claim 4 wherein said correction voltage is modulated to impart a keystone shape to the raster produced by scanning said cathode ray tube beam.

* * * * *